(12) United States Patent
Dedieu et al.

(10) Patent No.: US 9,419,634 B1
(45) Date of Patent: Aug. 16, 2016

(54) LOW-NOISE MULTIPLE PHASE OSCILLATOR

(71) Applicants: STMicroelectronics SA, Montrouge (FR); STMicroelectronics International N.V., Amsterdam (NL)

(72) Inventors: Sebastien Dedieu, La Terrasse (FR); Abhirup Lahiri, Delhi (IN)

(73) Assignees: STMICROELECTRONICS SA, Montrouge (FR); STMICROELECTRONICS INTERNATIONAL N.V., Amsterdam (NL)

(*) Notice: Subject to any disclaimer, the term of this patent is extended or adjusted under 35 U.S.C. 154(b) by 0 days.

(21) Appl. No.: 14/752,226

(22) Filed: Jun. 26, 2015

(51) Int. Cl.
*H03L 7/24* (2006.01)
*H03K 3/03* (2006.01)

(52) U.S. Cl.
CPC ............ *H03L 7/24* (2013.01); *H03K 3/0315* (2013.01)

(58) Field of Classification Search
CPC .................................. H03L 7/24; H03K 3/0315

USPC ................................................. 331/46, 47, 55
See application file for complete search history.

(56) References Cited

U.S. PATENT DOCUMENTS

| | | | |
|---|---|---|---|
| 6,188,291 B1 | 2/2001 | Gopinathan et al. | |
| 6,456,167 B1 | 9/2002 | Huang | |
| 6,686,806 B2* | 2/2004 | Dufour | H03K 3/354 331/135 |
| 7,436,266 B2 | 10/2008 | Byun et al. | |
| 8,143,955 B2* | 3/2012 | Rajendran | H03B 19/00 327/105 |
| 2013/0141143 A1* | 6/2013 | Sato | H03L 7/16 327/141 |

\* cited by examiner

*Primary Examiner* — Joseph Chang
(74) *Attorney, Agent, or Firm* — Gardere Wynne Sewell LLP

(57) ABSTRACT

A multiple phase oscillator includes a master oscillator that injection locks a first ring oscillator. The free-running frequency of the first ring oscillator is adjustable through a control signal. A second ring oscillator has a same structure as the first ring oscillator and is connected to operate in a free-running mode. The free-running frequency of the second ring oscillator is adjustable through the control signal. A control loop senses the output of the second ring oscillator and adjusts the control signal so that the free-running frequency of the second ring oscillator matches a desired value.

16 Claims, 2 Drawing Sheets

LOW-NOISE MULTIPLE PHASE OSCILLATOR

TECHNICAL FIELD

The invention relates to oscillators, in particular to low-noise multiple phase oscillators.

BACKGROUND

FIG. 1 is a schematic diagram of a conventional LC oscillator. The oscillator comprises a pair of N-type MOS transistors M1 and M2 that are cross-coupled by their drains and gates. The sources of transistors M1 and M2 are connected to a common bias current source Ib. The drain of each transistor M1 and M2 is connected to a high voltage supply node through a respective inductor La, Lb of same value. A capacitor C is connected between the drains of the transistors which form the differential outputs OPUT+ and OUT− of the oscillator. These output signals are in phase opposition. The output signals exhibit a low noise and a frequency that remains relatively accurate over a wide temperature range.

To provide more than two phases, for instance four phases in quadrature, it is known in the art to couple together two LC oscillators of the type shown in FIG. 1. Such a circuit is disclosed, for instance, in U.S. Pat. Nos. 6,456,167 and 7,436,266 (both incorporated herein by reference).

Thus, multiplying the number of low-noise oscillators to provide more phases is costly in terms of surface area, especially due to the inductors, and in terms of power consumption.

SUMMARY

In an embodiment, a multiple phase oscillator comprises: a master oscillator; a main ring oscillator connected to be injection locked to the low-noise oscillator and having a free-running frequency adjustable through a control signal; a secondary ring oscillator of same structure than the main ring oscillator, connected in free-running mode and having a free-running frequency adjustable through said control signal; and a control loop connected to an output of the secondary ring oscillator and configured to adjust the control signal so that the free-running frequency of the secondary ring oscillator assumes a desired value.

The oscillator may further comprise a first current source connected to bias the main ring oscillator and adjustable through said control signal; and a second current source of same structure than the first current source, connected to bias the secondary ring oscillator and adjustable through said control signal.

The control loop may comprise a frequency-to-voltage converter connected to an output of the secondary ring oscillator; and a differential amplifier connected to produce said control signal by amplifying the difference between the output of the frequency-to-voltage converter and a constant reference voltage.

The constant reference voltage and the conversion factor of the frequency-to-voltage converter may be based on band-gap references.

The oscillator may further comprise circuitry connected to the secondary ring oscillator and the control loop for regularly turning on and off the secondary ring oscillator and the control loop.

BRIEF DESCRIPTION OF THE DRAWINGS

Other advantages and features will become more clearly apparent from the following description of particular embodiments of the invention provided for exemplary purposes only and represented in the appended drawings, in which.

DETAILED DESCRIPTION

Figure 1:
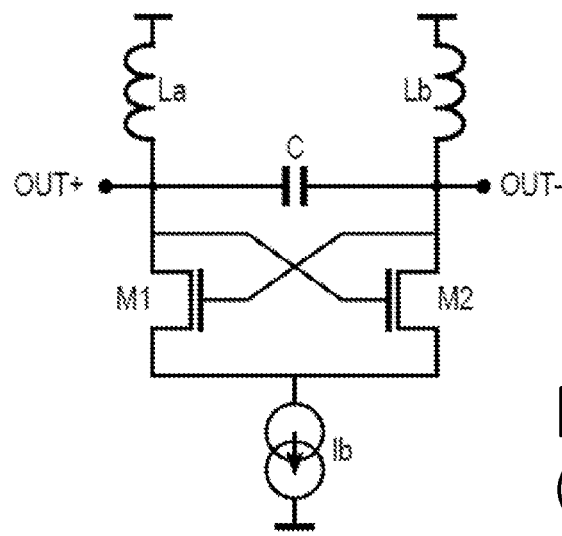
FIG. 1, previously described, is a schematic diagram of a conventional low-noise oscillator.
Figure 2:
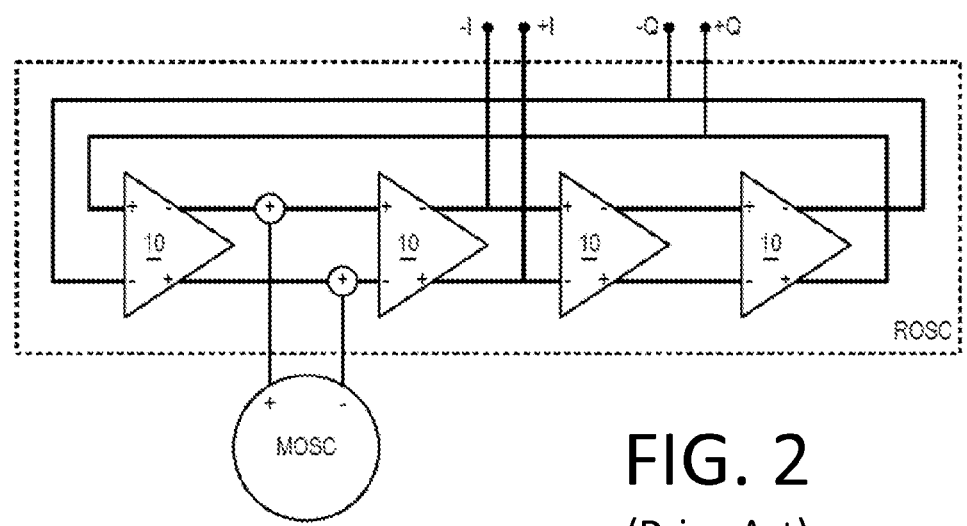
FIG. 2 is a block diagram of a conventional multiple phase oscillator based on an injection locked ring oscillator.

Reference is now made to FIG. 2 which illustrates a block-diagram of a multiple phase oscillator structure as disclosed in U.S. Pat. No. 6,188,291 (incorporated by reference). The oscillator comprises a master accurate oscillator MOSC, such as the LC oscillator of FIG. 1, connected to injection lock a ring oscillator ROSC.

The ring oscillator comprises multiple similar delay elements 10 connected in a ring. An odd number of the delay elements are connected to cause a phase inversion, whereby the signal is inverted at each revolution in the ring. As shown, the ring may include four differential delay elements 10. Each differential delay element has a pair of inverting and non-inverting inputs, and a pair of inverting and non-inverting outputs. Three of the differential delay elements may be connected to cause a phase inversion, i.e. the inverting and non-inverting inputs of one delay element are respectively connected to the non-inverting and inverting outputs of the previous element. The remaining delay element, the first one in the figure, is then connected as a buffer.

The ring oscillator has a free running frequency equal to twice the inverse of the sum of the delays. The delay elements usually being matched, each element introduces the same delay, whereby the ring oscillator provides multiple phases that are equally distributed over 180°.

Four delay elements provide phases at 0°, 45°, 90° and 135°. A differential delay element further provides two opposite phases, whereby the oscillator of FIG. 2 also provides phases at 180°, 225°, 270° and 315°. As shown, an in-phase signal +I and its opposite −I may be taken from the outputs of one of the delay elements, and a quadrature signal +Q and its opposite −Q may be taken from the outputs of the delay element two positions further. For a given number of phases, a ring oscillator consumes substantially less power and less surface area than an LC oscillator structure, A ring oscillator is however known to be noisy and inaccurate (due to process variations), and to drift with temperature.

To improve this situation, as shown, the differential outputs of the master oscillator MOSC are connected respectively to the two inputs of one of the delay elements 10 of the ring oscillator. With this configuration, under certain operating conditions, the master oscillator imposes its frequency to the ring oscillator, this phenomenon referred to in the art as injection locking.

The ring oscillator then produces multiple phases with noise and accuracy characteristics commensurate with the characteristics of the master oscillator, while consuming less power and surface area than, for example, multiple LC oscillators coupled to produce the same number of phases.

This satisfactory operation is however subject to design constraints caused by an inevitable mismatch between the free running frequency of the ring oscillator and the frequency of the master oscillator. Higher mismatches require more power from the master oscillator to achieve injection locking. As mentioned above, the ring oscillator free running frequency is subject to temperature drift. In some applications, the temperature drift may be such that the power provided by the master oscillator, designed for nominal operating conditions, is insufficient to injection lock the ring oscillator when the operating temperature exits a relatively small range.

Figure 3:
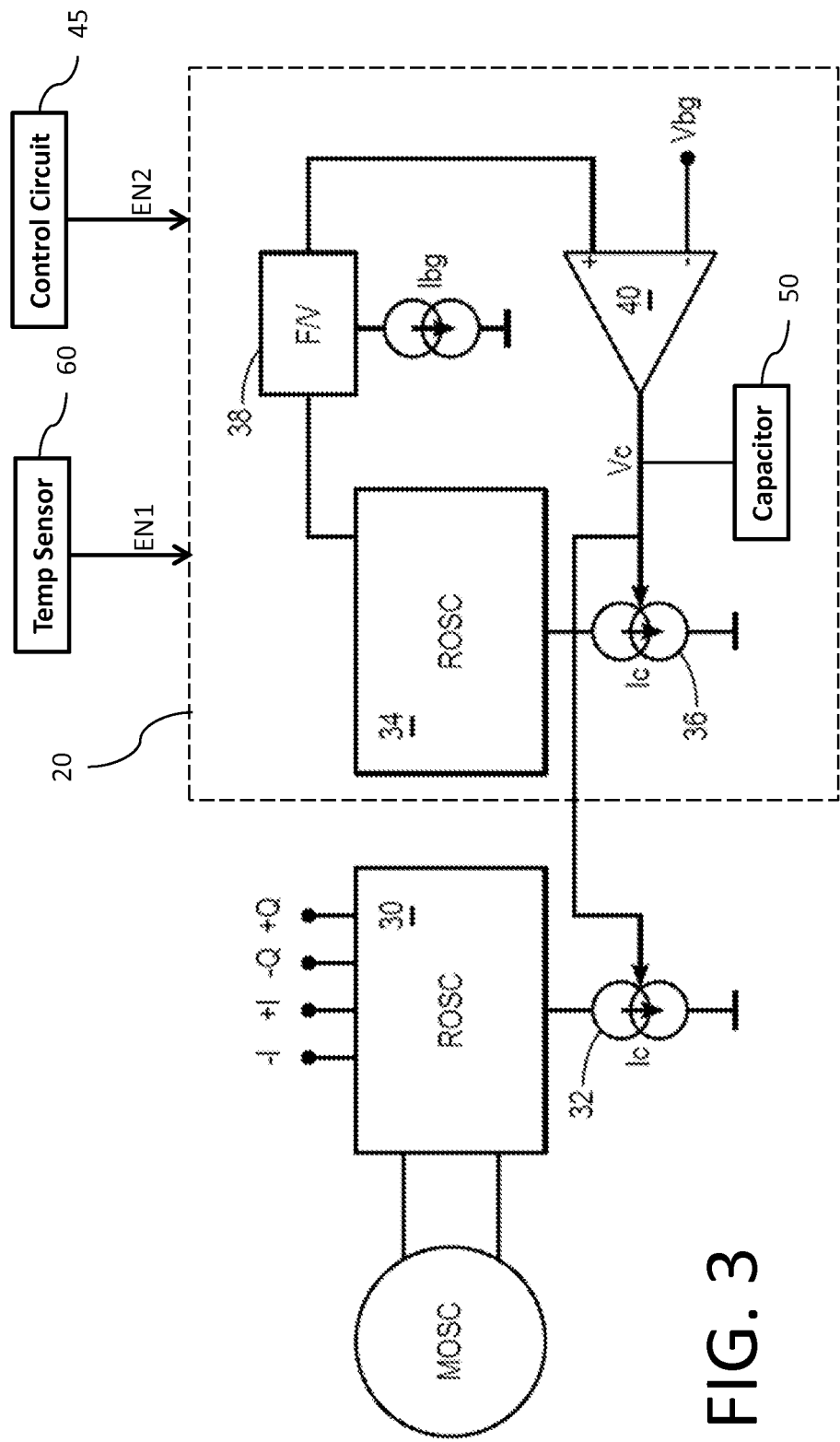
FIG. 3 is a block diagram of an injection locked ring oscillator incorporating an embodiment of a temperature compensation circuit.

FIG. 3 is a block diagram of an injection locked ring oscillator incorporating an embodiment of a temperature compensation circuit.

As in FIG. 2, the oscillator of FIG. 3 comprises a first ring oscillator 30 connected to be injection locked by a master oscillator MOSC. The first ring oscillator 30 may have a structure similar to that of FIG. 2. Each delay element of the ring oscillator may be in the form of a differential pair of N-MOS transistors biased by an individual current source. The multiple individual current sources biasing the delay elements are shown in FIG. 3 as a single current source 32 pulling a current Ic.

In practice, the delay value of the delay elements, and thus the free running frequency depends on the bias current Ic. Even though the current sources can be designed to be temperature compensated, this measure is insufficient to prevent temperature drift of the free running frequency, since the temperature drift depends also on other components of the delay elements.

The additional elements of FIG. 3, described now, form an embodiment of a temperature compensation circuit 20 for the free running frequency of the ring oscillator 30. This temperature compensation circuit comprises a second ring oscillator 34 that is designed to be matched to the first ring oscillator 30 and to operate under the same conditions (for instance placed next to the ring oscillator 30 on an integrated circuit chip).

Thus, the second ring oscillator 34 has the same structure as the main oscillator 30, i.e. the same delay elements biased by the same current Ic. The current sources biasing the delay elements of the secondary oscillator are shown as a single current source 36.

Contrary to the first ring oscillator 30, the second ring oscillator 34 is configured to oscillate freely. In other terms, even though both oscillators 30 and 34 are matched and biased by a same current, they will not oscillate strictly at the same frequency. Indeed, the first oscillator 30 is normally constrained to oscillate at the frequency of the master oscillator MOSC through injection locking, whereas the second oscillator 34 oscillates at its free running frequency.

Hence, if the temperature varies, the frequency of the second oscillator 34 will vary, whereas the frequency of the first oscillator will normally stay locked on the frequency of the master oscillator MOSC. However, the first ring oscillator 30 will only stay locked if the power provided by the master oscillator is sufficient. A purpose of the temperature compensation circuit is to adjust the free running frequency of both the first and second ring oscillators simultaneously so that the first ring oscillator can stay locked with a relatively low power level provided by the master oscillator over a wide temperature range.

To this end, the current sources 32 and 36 are adjustable through a same control signal Vc that is provided by a frequency control loop. The frequency control loop is configured to regulate the free running frequency of the second oscillator 34 to a constant value, typically equal to the frequency chosen by design for the master oscillator MOSC.

The frequency control loop may comprise a frequency-to-voltage (F/V) converter circuit 38 connected to an output of the second ring oscillator 34. The voltage output by the converter circuit 38, which is representative of the free running frequency of the second oscillator 34, is compared by a differential amplifier 40 to a reference voltage Vbg (which may, for example, comprise a fixed band-gap voltage). The output of the differential amplifier 40 provides the control voltage Vc to the current sources 32 and 36. If the differential amplifier 40 has infinite gain, the control loop tends to regulate the control voltage Vc to be equal to the reference voltage Vbg.

To obtain satisfactory temperature compensation, the elements of the control loop are preferably temperature independent. Components that may be influenced by temperature in the control loop are the conversion factor of the frequency-to-voltage converter 38 and the source providing the reference voltage Vbg. The conversion factor usually depends on the value of a current source Ibg. The current Ibg and the voltage Vbg may be provided by band-gap reference sources that are temperature independent.

To save power, the temperature compensation circuit need not operate at all times. Indeed, it may instead be selectively turned on (for example, periodically) for short durations. In an example, a control circuit 45 is provided to control the periodic turning on of the temperature compensation circuit through an enable signal (EN1), which may, for example, occur once every two seconds for a short on-time duration. While the compensation circuit is turned off by the control circuit 45, i.e. the elements 34, 38 and 40 are powered down, the control voltage Vc may be stored on a capacitor 50.

Alternatively, the temperature compensation circuit may be turned on as needed, for example, when the temperature variation exceeds a threshold. The temperature variation may be detected by a temperature sensor 60, such as a diode, which outputs an enable signal (EN2) configured to enable operation of the temperature compensation circuit. This enable signal EN2 may be applied directly to the circuit 20 or applied to the control circuit 45.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A multiple phase oscillator, comprising:
   a master oscillator;
   a first ring oscillator connected to be injection locked to the master oscillator and having a first free-running frequency adjustable through a control signal;
   a second ring oscillator having a same structure as the first ring oscillator, the second ring oscillator not injection locked to the master oscillator and operating in free-running mode having a second free-running frequency adjustable through said control signal; and
   a control loop connected to an output of the second ring oscillator and configured to adjust the control signal so that the second free-running frequency of the second ring oscillator matches a desired value.

2. The oscillator of claim 1, comprising:
   a first current source connected to bias the first ring oscillator and adjustable through said control signal; and
   a second current source having a same structure as the first current source and connected to bias the second ring oscillator and adjustable through said control signal.

3. The oscillator of claim 1, wherein the control loop comprises:

a frequency-to-voltage converter connected to an output of the second ring oscillator but not connected to an output of the first ring oscillator; and a differential amplifier connected to produce said control signal by amplifying a difference between an output of the frequency-to-voltage converter and a constant reference voltage.

4. The oscillator of claim 3, wherein the constant reference voltage and a conversion factor of the frequency-to-voltage converter are based on band-gap references.

5. The oscillator of claim 1, further comprising circuitry connected to the second ring oscillator and the control loop for periodically turning on and off the second ring oscillator and the control loop.

6. The oscillator of claim 1, further comprising circuitry connected to the second ring oscillator and the control loop for controlling turning on and off the second ring oscillator and the control loop in response to sensed temperature.

7. A method, comprising:
injection locking a first ring oscillator using an oscillation signal output from a master oscillator;
biasing operation of the first ring oscillator in response to a control signal, said first ring oscillator having a first free-running frequency that is adjusted through said control signal;
biasing operation of a second ring oscillator in response to said control signal, said second ring oscillator not injection locked to the master oscillator and operating in free-running mode having a second free-running frequency that is adjusted through said control signal;
sensing a frequency of an oscillation signal output from the second ring oscillator;
comparing said sensed frequency to a reference; and
adjusting the control signal to cause the sensed frequency to match the reference.

8. The method of claim 7, wherein sensing the frequency comprises converting the frequency to a voltage, and wherein comparing said sensed frequency to the reference comprises comparing the voltage to a reference voltage.

9. The method of claim 7, further comprising periodically performing the steps of sensing, comparing and adjusting.

10. The method of claim 7, further comprising: sensing temperature and performing the steps of sensing, comparing and adjusting in response to the sensed temperature.

11. A multiple phase oscillator, comprising:
a master oscillator;
a first ring oscillator connected to be injection locked to the master oscillator and having a first free-running frequency adjustable through a control signal;
a second ring oscillator not injection locked to the master oscillator and having a second free-running frequency adjustable through said control signal; and
a control loop connected to an output of the second ring oscillator and configured to adjust the control signal so that the second free-running frequency of the second ring oscillator matches a desired value.

12. The oscillator of claim 11, comprising:
a first current source connected to bias the first ring oscillator and adjustable through said control signal; and
a second current source connected to bias the second ring oscillator and adjustable through said control signal.

13. The oscillator of claim 1, wherein the control loop comprises:
a frequency-to-voltage converter connected to an output of the second ring oscillator but not connected to an output of the first ring oscillator; and
a differential amplifier connected to produce said control signal by amplifying a difference between an output of the frequency-to-voltage converter and a constant reference voltage.

14. The oscillator of claim 13, wherein the constant reference voltage and a conversion factor of the frequency-to-voltage converter are based on band-gap references.

15. The oscillator of claim 11, further comprising circuitry connected to the second ring oscillator and the control loop for periodically turning on and off the second ring oscillator and the control loop.

16. The oscillator of claim 11, further comprising circuitry connected to the second ring oscillator and the control loop for controlling turning on and off the second ring oscillator and the control loop in response to sensed temperature.

* * * * *